Figure 1A:
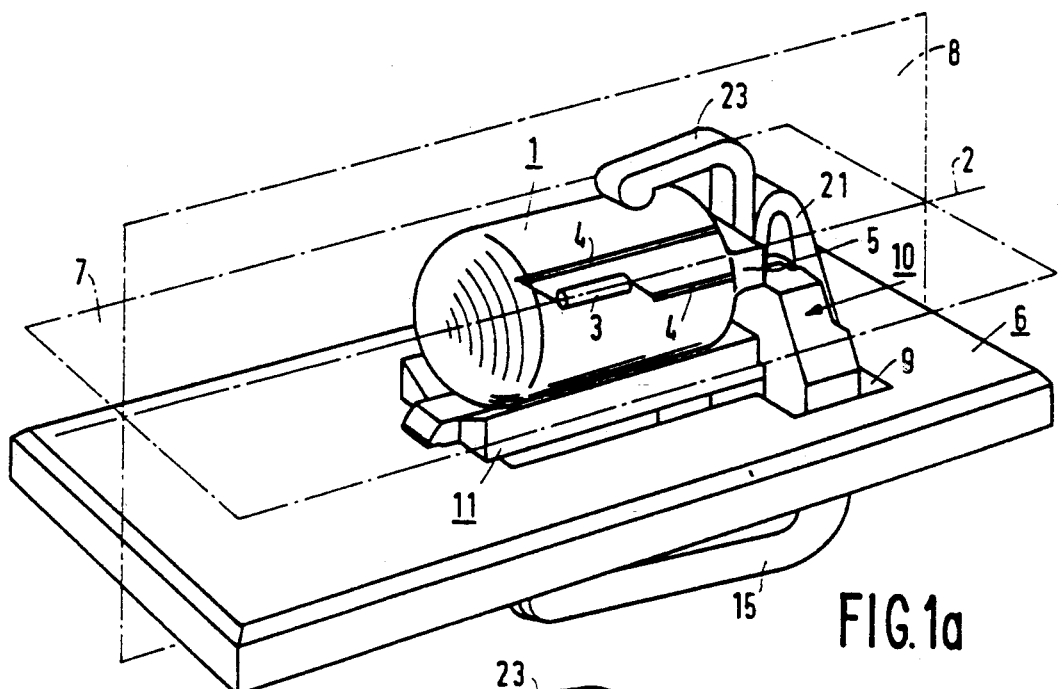

United States Patent [19]

Bax

[11] Patent Number: 5,264,998
[45] Date of Patent: Nov. 23, 1993

[54] ELECTRIC LAMP HAVING A CAP OF SYNTHETIC RESIN

[75] Inventor: Fransiscus W. M. Bax, Eindhoven, Netherlands

[73] Assignee: U.S. Philips Corporation, New York, N.Y.

[21] Appl. No.: 900,875

[22] Filed: Jun. 18, 1992

[30] Foreign Application Priority Data

Jul. 8, 1991 [EP] European Pat. Off. ............ 91201766

[51] Int. Cl.⁵ .................................................. H01R 33/00
[52] U.S. Cl. .................................... 362/226; 362/800; 439/56
[58] Field of Search ...................... 362/226, 396, 800; 439/56, 82

[56] References Cited

U.S. PATENT DOCUMENTS

| | | | |
|---|---|---|---|
| 1,037,096 | 8/1912 | Wood et al. | 362/396 |
| 1,680,951 | 8/1928 | Morrison | 162/396 |
| 4,547,840 | 10/1985 | Tinder | 362/226 |
| 4,897,769 | 1/1990 | Lang | 362/226 |
| 4,943,898 | 7/1990 | Weenink | 362/226 |
| 4,959,761 | 9/1990 | Critelli et al. | 362/226 |

FOREIGN PATENT DOCUMENTS 0208043 12/1955 Australia .................. 439/56

*Primary Examiner*—Albert J. Makay
*Assistant Examiner*—Alan B. Cariaso
*Attorney, Agent, or Firm*—Paul R. Miller

[57] ABSTRACT

An electric lamp having a cap (10) of synthetic resin is suitable for use on a printed circuit board (6). The cap (10) has resilient arms (15) extending parallel to a plane (8) through the axis (2) of the lamp vessel (1). The holder portion (11) of the cap (10) holding the lamp vessel (1), and the arms (15) can clamp a p.c.b. (6) in between them. Means (19, 21) may be present to keep the lamp fixed in an opening (9) in the p.c.b. (6) or at an edge thereof. The lamp requires little space on a p.c.b.

14 Claims, 2 Drawing Sheets

ELECTRIC LAMP HAVING A CAP OF SYNTHETIC RESIN

The invention relates to an electric lamp having a lamp cap of synthetic resin suitable for use on a printed circuit board, comprising:

a light-transmitting tubular lamp vessel having an axis, in which lamp vessel an electric element is arranged and connected to current conductors which pass to the exterior through a first end portion of the lamp vessel;

a lamp cap of synthetic resin provided with:

a holder on which the lamp vessel is accommodated;

first and second contact surfaces facing one another and situated at a distance from one another for clamping onto a printed circuit board, the current conductors each running over a respective contact surface, while the first contact surfaces are present at a free end portion of a respective resilient arm at the holder, which arm extends alongside the holder at a distance therefrom.

BACKGROUND OF THE INVENTION

Such an electric lamp is known from European Patent Application 0 017 016-A1.

The known lamp can be used on a printed circuit board whose thickness, both of the board itself and of the wiring, may vary between wide limits, while nevertheless a good electrical contact between the current conductors and the wiring is obtained. This is the result of the presence of arms at the holder which embrace the holder at a distance.

A disadvantage of the known lamp is that it is comparatively voluminous and occupies comparatively much space on a printed circuit board.

SUMMARY OF THE INVENTION

An object of the invention is to provide an electric lamp of the kind described in the opening paragraph which occupies little space on a printed circuit board.

According to the invention, this object is realised in that the first and the second contact surfaces extend substantially parallel to a first plane through the axis of the lamp vessel, and the arms extend parallel to one another substantially parallel to a second plane through the axis perpendicular to the first plane, the arms obliquely approaching the first plane with their free end portions.

Owing to the construction of the lamp according to the invention, the lamp extends longitudinally alongside a printed circuit board after being positioned thereon. As a result, the lamp occupies little space above and below the board, but is also requires very little space laterally of the lamp vessel.

A compact construction of the lamp is favorably made when the second contact surfaces are portions of a surface of the holder. The holder may then be so dimensioned together with the second contact surfaces that its dimensions along a printed circuit board transverse to the lamp vessel axis are smaller than those of the lamp vessel.

The current conductors may run over a second contact surface, but if they run over respective first contact surfaces, they are pressed against a printed circuit board independently of one another. In that case when the current conductors each run through a groove in surfaces of the arms remote from the holder, they are bent around the free end portions of the arms toward the relevant first contact surface. Assembling of lamp vessel and lamp cap is then easy with the grooves keeping the current conductors fixed in their positions.

In a favourable embodiment, the holder has a projection facing toward both arms. During mounting on a printed circuit board, this projection may enter a recess in the board, thus ensuring that the lamp will not be shifted owing to shocks or vibrations.

In a favourable embodiment, the arms each have a laterally extending projection at a distance from the holder. This projection may contribute to the mounted lamp lying with its holder substantially flat against a printed circuit board.

The lamp with the lamp cap may be passed over a printed circuit board from an edge thereof or from a recess in an edge thereof.

If the lamp is to be positioned elsewhere on a printed circuit board, this board may be provided with an opening or with openings through which the holder with the lamp cap is passed, or through which the arms are passed. The lamp may then be swivelled or shifted so as reach its final position. In these cases the lamp which is used remote from the edge of the board has an end position which overlaps only partly the opening in the board.

It is attractive when the first contact surfaces have an interspacing which is greater than the dimension of the holder and the lamp vessel transverse to the axis, parallel to the first plane through the axis. The lamp then has a very stable position on a printed circuit board.

In a very favourable embodiment, the holder has a fixation tongue near the first end portion of the lamp vessel, which tongue is resilient in the direction of the axis and which is provided with a recess for cooperating with a printed circuit board. The tongue may grip into an opening in such a board so as to keep a lamp provided in this opening fixed. Thus, the recess may ensure that the lamp cannot find its way back through the opening on its own accord, or also prevent that the lamp assumes a position in which the axis of the lamp vessel makes an angle with the board surface. The laterally extending projections present at the arms may also achieve the latter object. This embodiment has the advantage that the lamp substantially completely overlaps an opening in a printed circuit board when mounted in such an opening. For a simple assembly of the lamp vessel with the lamp cap the holder may be ductshaped for a transverse fixation of the lamp vessel, and may be provided with a resilient tongue which keeps the lamp vessel pressed against the holder. In an advantageous embodiment, the tongue also grips the first end portion of the lamp vessel, thus providing also an axial fixation. The current conductors fix the lamp vessel in the opposing axial direction.

This embodiment is not only very easy to assemble, but also requires very little synthetic resin, is light in weight and has a small volume.

The lamp cap of synthetic resin may be made of, for example, a thermoplastic resin, for example of polyether imide or polyether sulfon, possibly filled, for example with powder or fibers such as glass powder or glass fibers.

The electric lamp element may be, for example, an incandescent body or an LED, but alternatively it may be a pair of electrodes in an ionizable gas.

BRIEF DESCRIPTION OF THE DRAWING FIGURES

Figure 2A:
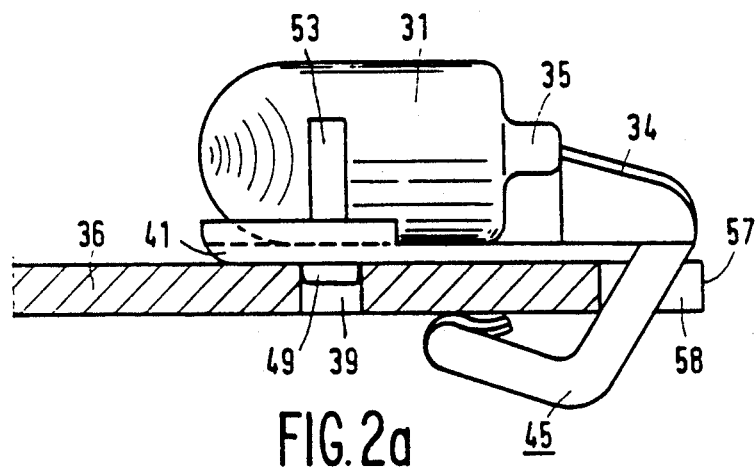

Embodiments of the lamp according to the invention are shown in the drawings, in which FIGS. 1a, b, c show a first embodiment in perspective view, in lateral elevation, and in bottom view, and, FIGS. 2a, b show a second embodiment in lateral elevation and bottom view, respectively.

DESCRIPTION OF THE INVENTION

In FIGS. 1a, b, c, the electric lamp having a lamp cap of synthetic resin suitable for use on a printed circuit board has a light-transmitting, tubular lamp vessel 1 with an axis 2 in which lamp vessel an electric element 3 is positioned. The element is connected to current conductors 4 which pass to the exterior through a first end portion 5 of the lamp vessel.

The lamp vesel is accommodated in the holder 11 of a synthetic-resin lamp cap 10 which has first contact surfaces 12 facing second contact surfaced 13. The first surfaces lie at a distance from the second surfaces so as to clamp onto a printed circuit board 6.

The current conductors 4 run over respective contact surfaces 12, and the first contact surfaces 12 are each present at a free end portion 14 of a respective resilient arm 15 at the holder 11, these arms 15 extending alongside the holder 11 at a distance therefrom.

In the lamp shown, the first 12 and the second 13 contact surfaces extend substantially parallel to a first plane 7 through the axis 2 of the lamp vessel 1. The arms 15 extend parallel to one another substantially parallel a second plane 8 through the axis and perpendicular to the first plane 7. The arms 15 obliquely approach the first plane 7 at their free end portions 14.

In the embodiment drawn, the second contact surfaces 13 are portions of a surface 16 of the holder 11. In an alternative embodiment, the second contact surfaces 13 may adjoin one another or coincide.

The current conductors 4 pass over respective first contact surfaces 12.

The arms 15 each have at a surface 17 remote from the holder 11 a groove 18 in which a current conductor 4 is accommodated, this conductor being bent around a free end portion 14 toward the relevant first contact surface 12.

The holder 11 has a projection 19 facing toward both arms 15 to cooperate with a cavity in a printed circuit board 6.

The arms 15 have a laterally extending projection 20 at a distance from the holder 11. It is achieved by this that the lamp is held with its axis 2 in the Figure substantially parallel to the board 6.

The first contact surfaces 12 have a separation which is greater than the dimension w of the holder 11 and the lamp vessel 1 transverse to the axis 2 and parallel to the first plane 7.

Near the first end portion 5 of the lamp vessel 1, the holder 11 has a fixation tongue 21 which is resilient in the direction of the axis 2 and has tongue 21 has a recess 22 for cooperating with the printed circuit board 6 when the lamp is provided in an opening 9 in such a board.

Figure 1B:
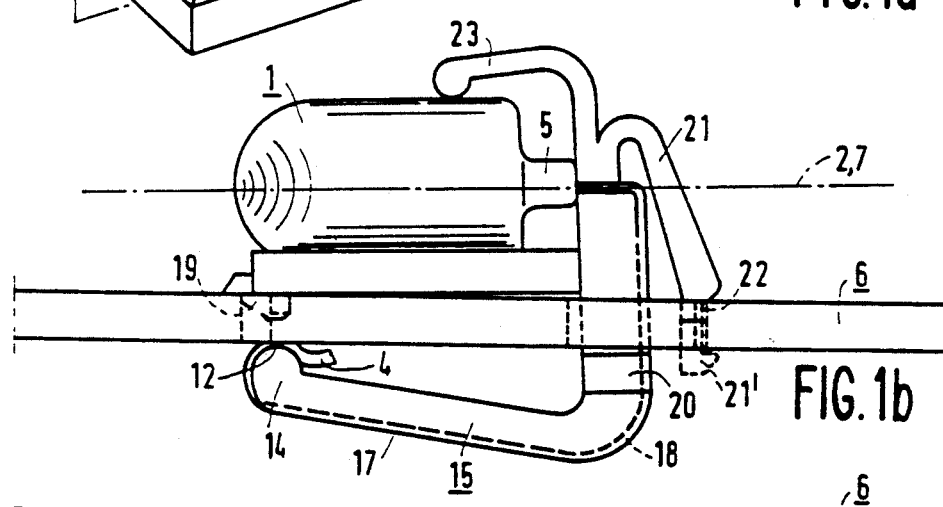

The fixation tongue 21 keeps the lamp fixed and prevents the lamp from finding its way back downward (FIG. 1b) through the opening 9. The tongue 21 with its recess 22 and the projections 20 keep the lamp vessel 1 substantially parallel to the board 6 in the embodiment drawn. In the embodiment where the tongue 21' is shown in broken lines, the recess 22 also has the function of the projections 20, which in that case are redundant.

The holder 11 has a resilient tongue 23 which keeps the lamp vessel 1 pressed against the holder.

It is an attractive characteristic of the lamp that the electric element 3, the incandescent body in the Figure, extends perpendicular to the direction in which the light is to radiate. In the case of a lamp with an axial light source mounted perpendicularly on a printed circuit board, the light source radiates only weakly in a direction perpendicular to the board.

Figure 1C:
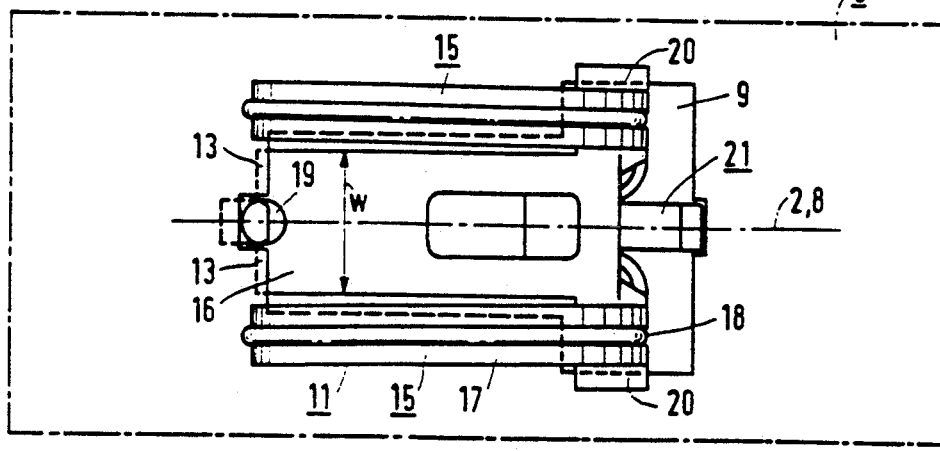
Figure 2B:
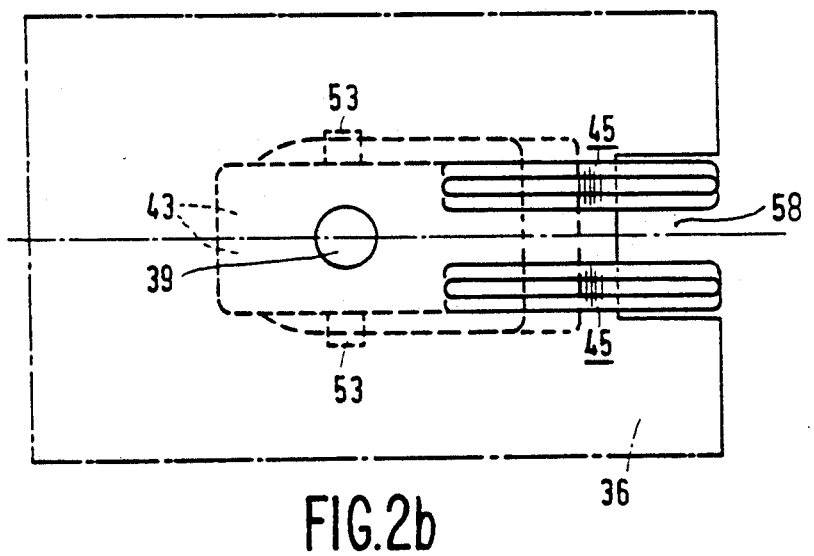

In FIG. 2, parts corresponding to parts in FIG. 1 have reference numerals which are 30 higher.

In this embodiment, the arms 45 are close together, so that the lamp is especially suitable for mounting on an edge 57 of a printed circuit board 36, for example, in a recess 58 at this edge. If the board 36 has an opening 39 for a projection 49, the lamp is securely fixed in its final position. The second contact surfaces 43 adjoin one another in the embodiment drawn. The duct-shaped holder 41 has two laterally engaging tongues 53 for keeping the lamp vessel 31 fixed.

I claim:

1. An electric lamp having a lamp cap of synthetic resin suitable for use on a printed circuit board comprising:

a printed circuit board, a tubular, light-transmitting lamp vessel having a longitudinal axis substantially parallel to said printed circuit board, an electric element disposed within said tubular lamp vessel, current conductors connected to said electric element and passing through a first end portion of said lamp vessel to the exterior, a lamp cap structure of synthetic resin including holder means for accommodating said lamp vessel on said printed circuit board, and first and second contact surfaces fixed at said printed circuit board, said first and second contact surfaces being situated at a distance from one another, said holder means including respective resilient arms having a free end portion adjacent to said first contact surfaces, said current conductors extending along said respective resilient arms to said free end portion, said first and second contact surfaces each extending parallel to a first plane through said longitudinal axis, said first plane being substantially parallel to said printed circuit board, and said resilient arms extending parallel to one another and parallel to a second plane through said longitudinal axis, said second plane being perpendicular to said first plane, said resilient arms obliquely extending toward said first plane.

2. An electric lamp according to claim 1, wherein said second contact surfaces are portions of a surface of said holder means.

3. An electric lamp according to claim 2, wherein said current conductors extend over respective first contact surfaces.

4. An electric lamp according to claim 3, wherein said resilient arms each have grooves in a surface remote from said holder means, said grooves accommodating said current conductors, said respective current conductors being bent around said respective free end portions toward said relevant first contact surface.

5. An electric lamp according to claim 3, wherein said holder means include a projection facing respective resilient arms and cooperating with a cavity in said printed circuit board.

6. An electric lamp according to claim 3, wherein said resilient arms have laterally extending projections at a distance from said holder means.

7. An electric lamp according to claim 3, wherein said first contact surfaces are spaced apart by a distance greater than a dimension of both said holder means and said lamp vessel in a direction perpendicular to said longitudinal axis.

8. An electric lamp according to claim 3, wherein said holder means includes a duct-shaped member having a resilient tongue, said resilient tongue keeping said lamp vessel pressed against said holder member.

9. An electric lamp according to claim 1, wherein said first contact surfaces are spaced apart by a distance greater than a dimension of both said holder means and said lamp vessel in a direction perpendicular to said longitudinal axis.

10. An electric lamp according to claim 1, wherein said holder means includes a duct-shaped member having a resilient tongue, said resilient tongue keeping said lamp vessel pressed against said holder member.

11. An electric lamp having a lamp cap of synthetic resin suitable for use on a printed circuit board comprising:
   a printed circuit board,
   a tubular, light-transmitting lamp vessel having a longitudinal axis substantially parallel to said printed circuit board,
   an electric element disposed within said tubular lamp vessel,
   current conductors connected to said electric element and passing through a first end portion of said lamp vessel to the exterior,
   a lamp cap structure of synthetic resin including holder means for accommodating said lamp vessel on said printed circuit board, and first and second contact surfaces fixed at said printed circuit board, said first and second contact surfaces being situated at a distance from one another,
   said holder means including respective resilient arms having a free end portion adjacent to said first contact surfaces, said current conductors extending along said respective resilient arms to said free end portion,
   said first and second contact surfaces each extending parallel to a first plane through said longitudinal axis, said first plane being substantially parallel to said printed circuit board,
   said resilient arms extending parallel to one another and parallel to a second plane through said longitudinal axis, said second plane being perpendicular to said first plane, said resilient arms obliquely extending toward said first plane,
   wherein said current conductors extend over respective first contact surfaces,
   wherein said first contact surfaces are spaced apart by a distance greater than a dimension of both said holder means and said lamp vessel in a direction parallel to said first plane, and
   wherein a resilient fixing tongue is disposed at said holder means adjacent said first end portion of said lamp vessel, said resilient fixing tongue being resilient in the direction of said longitudinal axis, and said resilient fixing tongue having a recess to engage said printed circuit board.

12. An electric lamp according to claim 11, wherein laterally extending projections are disposed at said resilient arms to cooperate with said recess of said resilient fixing tongue for maintaining position of said lamp vessel.

13. An electric lamp having a lamp cap of synthetic resin suitable for use on a printed circuit board comprising:
   a printed circuit board,
   a tubular, light-transmitting lamp vessel having a longitudinal axis substantially parallel to said printed circuit board,
   an electric element disposed within said tubular lamp vessel,
   current conductors connected to said electric element and passing through a first end portion of said lamp vessel to the exterior,
   a lamp cap structure of synthetic resin including holder means for accommodating said lamp vessel on said printed circuit board, and first and second contact surfaces fixed at said printed circuit board, said first and second contact surfaces being situated at a distance from one another,
   said holder means including respective resilient arms having a free end portion adjacent to said first contact surfaces, said current conductors extending along said respective resilient arms to said free end portion,
   said first and second contact surfaces each extending parallel to a first plane through said longitudinal axis, said first plane being substantially parallel to said printed circuit board,
   said resilient arms extending parallel to one another and parallel to a second plane through said longitudinal axis, said second plane being perpendicular to said first plane, said resilient arms obliquely extending toward said first plane,
   wherein said first contact surfaces are spaced apart by a distance greater than a dimension of both said holder means and said lamp vessel in a direction parallel to said first plane, and
   wherein a resilient fixing tongue is disposed at said holder means adjacent said first end portion of said lamp vessel, said resilient fixing tongue being resilient in the direction of said longitudinal axis, and said resilient fixing tongue having a recess to engage said printed circuit board.

14. An electric lamp according to claim 13, wherein laterally extending projections are disposed at said resilient arms to cooperate with said recess of said resilient fixing tongue for maintaining position of said lamp vessel.

* * * * *